United States Patent [19]

Soneda

[11] Patent Number: 4,802,130
[45] Date of Patent: Jan. 31, 1989

[54] SENSE AMPLIFIER

[75] Inventor: Mitsuo Soneda, Kanagawa, Japan

[73] Assignee: Sony Corporation, Tokyo, Japan

[21] Appl. No.: 38,752

[22] Filed: Apr. 15, 1987

[30] Foreign Application Priority Data

Apr. 24, 1986 [JP] Japan .................. 61-093456

[51] Int. Cl.[4] .................................. G11C 7/00
[52] U.S. Cl. ...................... 365/205; 307/530
[58] Field of Search ............ 307/530, 279; 365/205, 365/207, 208

[56] References Cited

U.S. PATENT DOCUMENTS 4,039,861  8/1977  Heller et al. ............. 365/208

OTHER PUBLICATIONS

S. E. Schuster, "Sense Amplifier with Resistive Decoupling of Bit Lines", IBM Technical Disclosure Bulletin, vol. 23, No. 7A, Dec. 1980, pp. 3037-3038.

Primary Examiner—Joseph A. Popen
Attorney, Agent, or Firm—Lewis H. Eslinger; Jay H. Maioli

[57] ABSTRACT

A sense amplifier includes two cross-coupled field effect transistors capacitively coupled to respective bit lines from a memory cell. During a precharging operation two capacitors are charged to precharged voltages indicative of the threshold dispersion voltage between the two transistors. Thereafter, during a sensing operation, the precharged voltages are applied to the gates of the transistors to compensate for the threshold dispersion voltage.

5 Claims, 3 Drawing Sheets

SENSE AMPLIFIER

FIELD OF THE INVENTION

The present invention relates to a sense amplifier and more particularly is directed to a sense amplifier for amplifying sensed information signals appearing on bit lines from respective memory cells in a memory.

BACKGROUND OF THE INVENTION

In computer, information-processing and control systems, it is necessary to store digital data and to retrieve it as desired. In a semiconductor memory, an array of storage or memory cells is used, with each memory cell holding one bit of data. When the information can be randomly put into or taken out of each memory cell or element as required, the array is called a random access memory (RAM) which may be static (SRAM) or dynamic (DRAM). The individual memory cells are addressed by data input and output lines, with each memory cell commonly having two output bit lines for indicating the presence of a "0" or "1" bit read out from the memory cell. The "0" and "1" bits are represented by different voltages which, when stored in the memory cells, may be quite small and may accumulate errors tending to reduce the difference between the respective voltages. Therefore, it is advantageous to include sense amplifiers connected to the output bit lines which are adapted to more accurately detect the voltages appearing on the bit lines and to latch the digital bit indicated thereby to provide a more accurate read out.

One advantageous example of such a sense amplifier includes cross-coupled field effect transistors each having a first current carrying electrode (source or drain electrode) coupled to a respective one of the bit lines and a gate electrode coupled to the other of the bit lines. Second current carrying electrodes (drain or source electrodes) of the transistors are coupled together to receive a control signal which permits or prevents turning ON of the transistors. If, for example, NMOS transistors are used, each transistor will turn ON when the difference between the gate voltage and the source voltage is greater than the threshold voltage of the transistor. The signal to be sensed appears on only one of the bit lines, which then carries a voltage higher or lower than the other bit line, depending on the value of the sensed signal. Consequently, when the control signal applied to the connected second current carrying electrodes is lowered to permit turn ON of the two transistors, the transistor having its gate electrode coupled to the bit line carrying the higher voltage will turn ON first. The other transistor will thereafter be maintained in its off state to latch the information read out from the memory cell.

However, the sensitivity of such a sense amplifier depends critically on the threshold voltage $V_{th}$ of each field effect transistor. If the threshold voltage of the transistor which is intended to turn ON first becomes significantly larger than the threshold voltage of the other transistor, it may happen that the other transistor will turn ON instead of the first transistor, resulting in an erroneous read operation. The threshold voltage of a field effect transistor varies in a known way with its channel length, and the development of VLSI integration and miniaturization techniques has made the channel length shorter and shorter and the possible dispersion, or different, in the threshold voltages correspondingly larger and larger. The resulting increased possibility of sensing errors is a significant limitation upon higher integration and miniaturization.

OBJECTS AND SUMMARY OF THE INVENTION

It is therefore an object of the present invention to provide a sense amplifier which removes the above-described difficulties of the prior art.

It is a further object of the present invention to provide a sense amplifier which can reliably sense a read out signal in a highly miniaturized construction.

It is yet a further object of the present invention to provide a sense amplifier which compensates for threshold voltage differences of cross-coupled field effect transistors therein.

In accordance with an aspect of the present invention, a sense amplifier of the type including first and second bit lines for receiving sensed signals and first and second cross-coupled field effect transistors each having a gate electrode and first and second current carrying electrodes comprises capacitive means for capacitively coupling the first current carrying electrodes of the first and second transistors with the second and first bit lines, respectively, first switching means for separably connecting the gate electrodes of the first and second transistors with the first current carrying electrodes of the same transistors, respectively, and second switching means for separably connecting the first current carrying electrodes of the first and second transistors with the first and second bit lines, respectively, the first and second switching means and the second current carrying electrodes of the first and second transistors being responsive to respective control signals for compensating the sense amplifier for threshold voltage differences of the first and second transistors.

In accordance with the present invention, the capacitive means precharges to voltages compensating for a dispersion between the threshold voltages of the first and second transistors during a precharging operation of the sense amplifier prior to its sensing operation and then supplies the precharged voltages to the gate electrodes of the first and second transistors during the sensing operation.

The above and other objects of the present invention will become apparent from reading the following detailed description of a preferred embodiment of the invention in conjunction with the accompanying drawings.

DETAILED DESCRIPTION OF THE PREFERRED EMBODIMENT

Figure 3:
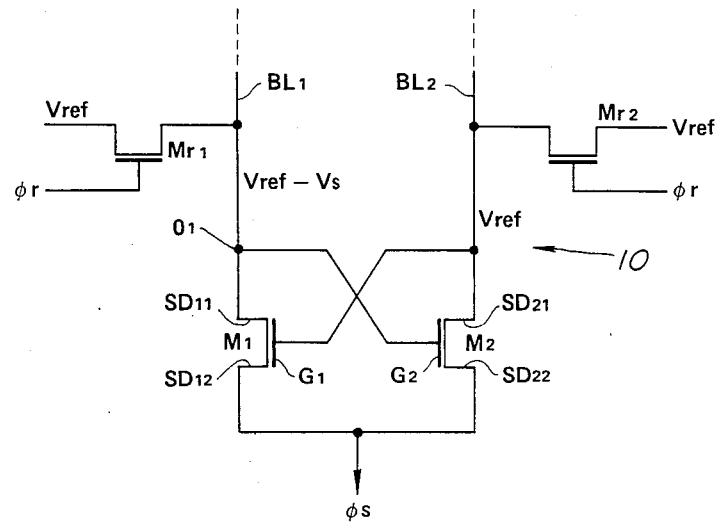
FIG. 3 is circuit diagram of a conventional sense amplifier.

In order that the purposes served by the present invention may be fully appreciated, a sense amplifier 10 according to the prior art will first be described with reference to FIGS. 3 and 4. As shown on FIG. 3, sense amplifier 10 according to the prior art has first and second field effect transistors (FETs) $M_1$ and $M_2$ which, in the illustrated example, are NMOS field effect transistors (n-channel FETs). Those skilled in the art will recognize that a corresponding sense amplifier could be constructed using PMOS field effect transistors with appropriate changes in the control signals to be described below. The first transistor $M_1$ has a first current carrying electrode $SD_{11}$ connected to a first bit line $BL_1$ extending from a memory cell (not illustrated). Correspondingly, the second transistor $M_2$ has a first current carrying electrode $SD_{21}$ connected to a second bit line $BL_2$ extending from the memory cell. Transistors $M_1$ and $M_2$ also include second current carrying electrodes $SD_{12}$ and $SD_{22}$, respectively, which are connected together to receive a common control signal $\phi_s$. Since transistors $M_1$ and $M_2$ are n-channel FETs, the first current carrying electrodes $SD_{11}$, $SD_{21}$ are the drain electrodes, while the second current carrying electrodes $SD_{12}$, $SD_{22}$ are the source electrodes.

A gate electrode $G_1$ of transistor $M_1$ is connected to bit line $BL_2$, while a gate electrode $G_2$ of transistor $M_2$ is connected to bit line $BL_1$. A reference voltage $V_{ref}$ is supplied to bit line $BL_1$ through a control transistor $Mr_1$ which is turned ON and OFF in response to a control signal $\phi_r$. Reference voltage $V_{ref}$ is also supplied to bit line $BL_2$ through a second control transistor $Mr_2$ similarly controlled by control signal $\phi_r$. Control transistors $Mr_1$ and $Mr_2$ are advantageously constructed in the same technology as transistors $M_1$, $M_2$, here n-channel FETs.

The operation of sense amplifier 10 according to the prior art will now be described with reference to FIG. 4, wherein the upper line A indicates control signal $\phi_s$, the middle line B indicates voltage $V_{G1}$, appearing at gate electrode $G_1$ of transistor $M_1$, and the lower line C indicates the voltage $V_{G2}$ appearing at gate electrode $G_2$ of transistor $M_2$. Control signal $\phi_r$ (not illustrated) is initially at a high level to maintain transistors $Mr_1$ and $Mr_2$ in the ON condition so that $V_{ref}$ is impressed on both bit lines $BL_2$ and $BL_2$. For the purpose of this example, let it be assumed that the bit to be read out of the memory cell is a digital "0" having a positive sense voltage $V_s$ and is impressed on bit line $BL_1$ as $V_{ref}-V_s$ in accordance with known principles. Sense amplifier 10 is provided for the purpose of sensing sense voltage $V_s$ and outputting, for example, at the junction $O_1$ on FIG. 3, a low voltage $V_L$ equal to a standard voltage for a "0" bit in the particular system and which can be recognized as such by other circuit elements. Similarly, sense amplifier 10 will output, at junction $O_1$ a high voltage $V_H$ equal to a standard voltage for a "1" bit in the particular system when sense voltage $V_s$ indicating a stored "1" bit is read out from the memory cell and impressed on bit line $BL_1$ as $V_{ref}+V_s$, as discussed below.

As is well known, n-channel FETs such as transistors $M_1$ and $M_2$ turn on only when $V_{GS} > V_{th}$, that is, when the gate to source voltage $V_{GS}$, equal to the gate voltage $V_G$ minus the source voltage $V_S$, is greater than the threshold voltage $V_{th}$ of the respective transistor. Threshold voltage $V_{th}$ is a positive voltage for n-channel FETs, and may be in the range of 2-4 volts. Let it further be assumed initially for this example that transistors $M_1$ and $M_2$ have the same threshold voltage $V_{th}$. Ideally, all transistors created on a silicon wafer during the same manufacturing process should have the same threshold voltage $V_{th}$, but in fact the individual threshold voltages $V_{th}$ vary over a range of values which can lead to sensing errors as discussed below.

Figure 4:
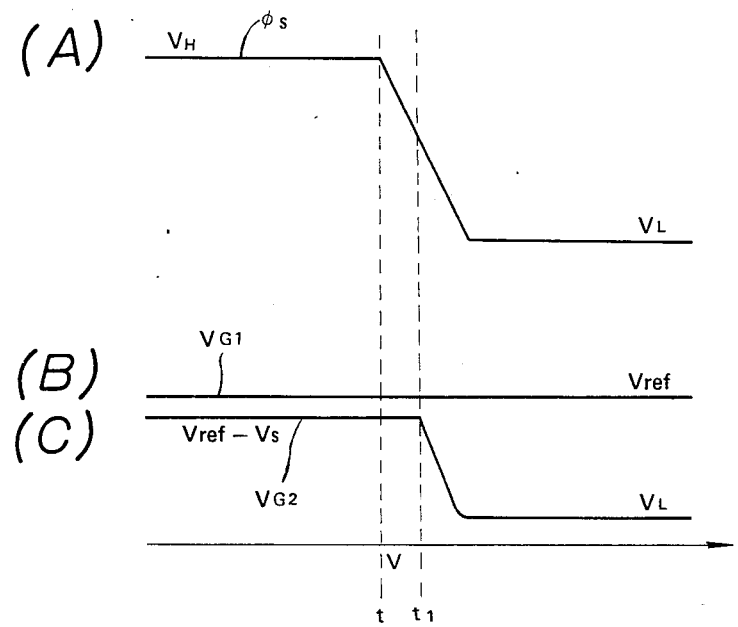
FIGS. 4(A) to 4(F) are timing diagrams used in explaining the operation of the sense amplifier of FIG. 3.

Initially, as shown in line A of FIG. 4, control signal $\phi_s$ is at high voltage $V_H$ higher than reference voltage $V_{ref}$. Voltage $V_{G1}$ (line B) is the voltage on bit line $BL_2$, that is, $V_{ref}$, while voltage $V_{G2}$ (line C) is the voltage on bit line $BL_1$, that is, $V_{ref}-V_s$. Consequently, $$V_{GS1} = V_{G1} - \phi_s = V_{ref} - V_H < 0$$

$$V_{GS2} = V_{G2} - \phi_s = V_{ref} - V_s - V_H < 0$$

and both transistors $M_1$ and $M_2$ are OFF.

Subsequently, at time t, a sensing operation of sense amplifier 10 is initiated and control signal $\phi_s$ begins to decrease towards $V_L$. Shortly thereafter, at time t', control signal $\phi_s$ will have dropped to a value where $$V_{GS1} = V_{ref} - \phi_s > V_{th}$$

while $$V_{GS2} = V_{ref} - V_s - \phi_s < V_{th}$$

so that transistor $M_1$ turns ON first while transistor $M_2$ remains OFF. With transistor $M_1$ ON, current flows from electrode $SD_{11}$ to electrode $SD_{12}$ so that, as control signal $\phi_s$ continues to decrease, the voltage on bit line $BL_1$ is pulled down to $V_L$, as shown in line C of FIG. 4. Moreover, since the voltage on bit line $BL_1$ is voltage $V_{G2}$, both the gate voltage $V_{G2}$ and the source voltage $V(SD_{22}) = \phi_s$ of transistor $M_2$ are pulled down together so that the gate to source voltage $V_{GS2}$ never exceeds $V_{th}$, and transistor $M_2$ remains OFF throughout the sensing operation. Consequently, the voltage on bit line $BL_2$ is not pulled down and stays at $V_{ref}$, so that transistor $M_1$ stays ON. The result is that the digital bit "0" is latched in sense amplifier 10 with transistor $M_1$ ON and transistor $M_2$ OFF. This state may be sensed and the low voltage $V_L$ at electrode $SD_{11}$ connected to junction $O_1$ may be taken out for supply to other circuit elements.

Correspondingly, when a digital "1" is read from the memory cell and impressed on bit line $BL_1$ as voltage $V_{ref}+V_s$, the reduction of control signal $\phi_s$ toward $V_L$ will cause transistor $M_2$ to turn ON first, since $$V_{GS2} = V_{G2} - \phi_s = V_{ref} + V_s - \phi_s > V_{GS1} = V_{ref} - \phi_s.$$

Now it is the voltage at electrode $SD_{21}$ which is pulled down because transistor $M_2$ is ON, while transistor $M_1$ is held in the OFF state as its gate to source voltage $V_{GS1}$ never exceeds $V_{th}$. Sense amplifier 10 at the end of the sensing operation now has transistor $M_1$ OFF and transistor $M_2$ ON, which state is opposite to that when a digital "0" is read out of the memory cell.

The correct operation of sense amplifier 10 is critically dependent on the values of the threshold voltages $V_{th}$ of transistors $M_1$ and $M_2$ to ensure that the appropriate transistor will always be turned on first. When the two threshold voltages are equal, the read out sense voltage $V_s$ will be correctly sensed regardless of the value of sense voltage $V_s$. However, with increasing miniaturization and higher and higher integration, the channel length L of each FET becomes shorter and shorter and therefore the effect of small differences in channel length L becomes more significant. The threshold voltage $V_{th}$ of each FET is dependent on the channel length L, and so the dispersion in threshold voltage is increased as the channel length L is decreased, increasing the risk of sensing errors and thereby limiting further miniaturization.

In particular, using the example of sensing a digital "0", transistor $M_1$ must always turn ON before transistor $M_2$, or in other words, the condition for accurate and reliable sensing is $$V_{GS2} - V_{th2} < V_{GS1} - V_{th1} \text{ always.}$$

Since $$V_{GS2} = V_{ref} - V_s - \phi_s \text{ and } V_{GS1} = V_{ref} - \phi_s,$$

the reliable sensing condition is equivalently $$V_{ref} - V_s - V_{th2} < V_{ref} - V_{th1}$$

or $$V_s > |V_{th1} - V_{th1}| = \Delta V_{th}.$$

With increasing miniaturization, $\Delta V_{th}$ increases as discussed above, while $V_s$, which is proportional to the electrical charge stored in the memory cell and read out therefrom, becomes smaller. Consequently, the likelihood of sensing errors becomes greater and greater and eventually becomes unacceptable.

The present invention eliminates sensing errors due to the dispersion in threshold voltage $V_{th}$ by compensating the gate voltages $V_{G1}$ and $V_{G2}$ applied to gate electrodes $G_1$ and $G_2$ of transistors $M_1$ and $M_2$. More particularly, in accordance with the invention, the gate electrodes $G_1$ and $G_2$ and the bit lines $BL_2$ and $BL_1$ are respectively capacitively connected and a voltage corresponding to the threshold dispersion voltage $\Delta V_{th}$ is accumulated during a precharging operation prior to the sensing operation for compensating transistors $M_1$ and $M_2$ to ensure a highly accurate and reliable sensing operation. To this end, and as shown on FIG. 1, during the precharging operation, the field effect transistors $M_1$ and $M_2$ are placed in a common drain configuration so as to effectively to operate as diodes, and capacitors $C_1$ and $C_2$ are connected between gate electrodes $G_1$ and $G_2$ and bit lines $BL_2$ and $BL_1$, respectively, and are charged through such "diodes" to respective precharged voltages. During the sensing operation, transistors $M_1$ and $M_2$ are operative in the conventional sense amplifying manner described above with reference to the prior art circuit of FIG. 3, but are compensated by the precharged voltages applied by the respective capacitors $C_1$ and $C_2$ to gate electrodes $G_1$, $G_2$ to remove the effect of any threshold dispersion voltage $\Delta V_{th}$.

More particularly, during the precharging period when transistors $M_1$ and $M_2$ are connected in the diode configuration, the voltage across the "diode" from gate electrode $G_1$ to source electrode $SD_{12}$ equals threshold voltage $V_{th1}$, while the voltage across the "diode" from gate electrode $G_2$ to source electrode $SD_{22}$ of transistor $M_2$ equals the threshold voltage $V_{th2}$. The capacitors $C_1$ and $C_2$, coupled between these "diodes" and the respective bit lines receiving the reference voltage $V_{ref}$ therefore accumulate respective charges equal to the difference between voltage $V_{ref}$ and the voltage of control signal $\phi_s$ minus $V_{th1}$ and $V_{th2}$, respectively. Thereafter, when transistors $M_1$ and $M_2$ are returned to their usual sense amplifying configuration, the difference between the two precharged voltages accumulated on the capacitors corresponds to the threshold dispersion voltage $\Delta V_{th} = |V_{th1} - V_{th2}|$, so that the sensing operation is compensated.

Figure 1:
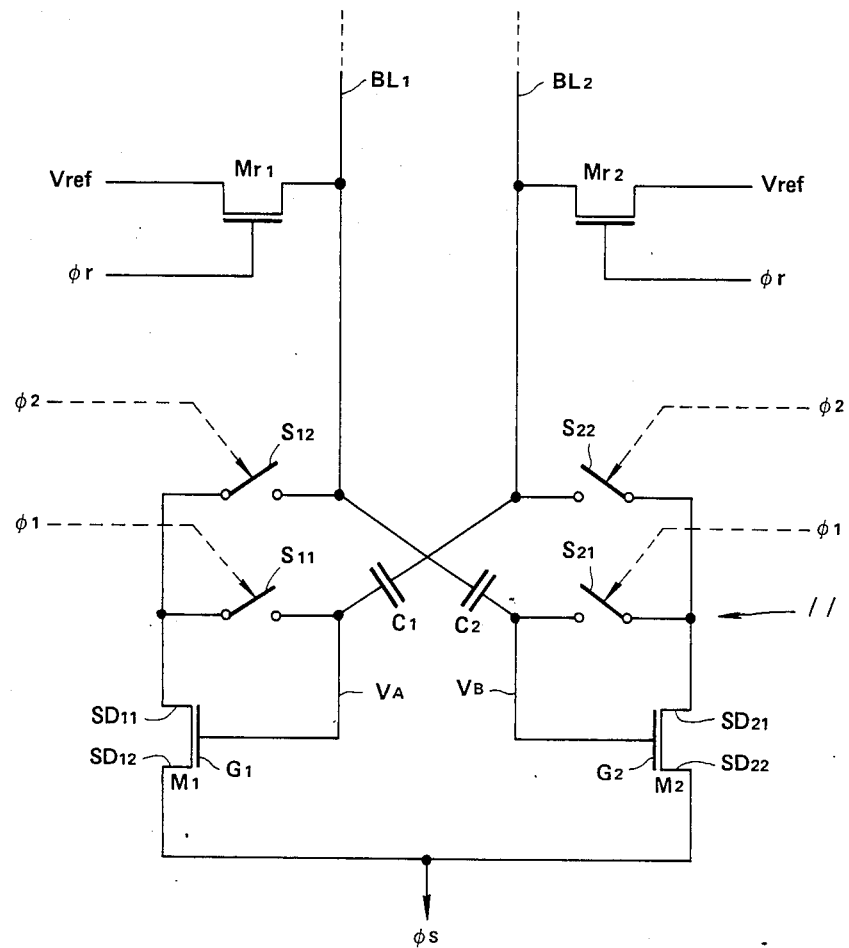
FIG. 1 is a circuit diagram of a sense amplifier according to a preferred embodiment of the present invention.

More specifically, as shown on FIG. 1, a sense amplifier 11 according to a preferred embodiment of the present invention has the first capacitor $C_1$ connected in series between gate electrode $G_1$ and bit line $BL_2$ and the second capacitor $C_2$ connected in series between gate electrode $G_2$ and bit line $BL_1$. First switches $S_{12}$ and $S_{22}$ separately connect drain electrode $SD_{11}$ with bit line $BL_1$ and drain electrodes $SD_{21}$ with bit line $BL_2$, respectively, prior to the connections between capacitors $C_2$ and $C_1$ and bit lines $BL_1$ and $BL_2$ so that, when switches $S_{12}$ and $S_{22}$ are open, the capacitors $C_1$ and $C_2$ are still connected with bit lines $BL_2$ and $BL_1$. First switches $S_{12}$, $S_{22}$ are ganged so as to open and close together in response to a control signal $\phi_2$.

Transistor $M_1$ has its gate electrode $G_1$ and its drain electrode $SD_{11}$ separably connected by a switch $S_{11}$ connected before the series connection of gate electrode $G_1$ to capacitor $C_1$. Correspondingly, transistor $M_2$ has its gate electrode $G_2$ separably connected to its drain electrode $SD_{21}$ by a switch $S_{21}$ connected before the series connection of gate electrode $G_2$ to capacitor $C_2$. Switches $S_{11}$ and $S_{21}$ are ganged and so as to open and close together in response to a control signal $\phi_1$. When switches $S_{11}$ nd $S_{21}$ are closed, the gate and drain electrodes of the n-channel FETs are connected in a common drain configuration and function equivalently to diodes with the forward voltage taken from gate to source. Switches $S_{11}$ $S_{12}$, $S_{21}$ and $S_{22}$ may all be constructed as control transistors similar to the transistors $Mr_1$ and $Mr_2$, and are "open" when OFF and "closed" when ON. It will be appreciated that, apart from the added capacitors $C_1$ and $C_2$ and switches $S_{11}$,$S_{12}$,$S_{21}$ and $S_{22}$, the sense amplifier 11 embodying the invention is similar to the previously described sense amplifier 10 according to the prior art and has its corresponding parts identified by the same references.

Figure 2:
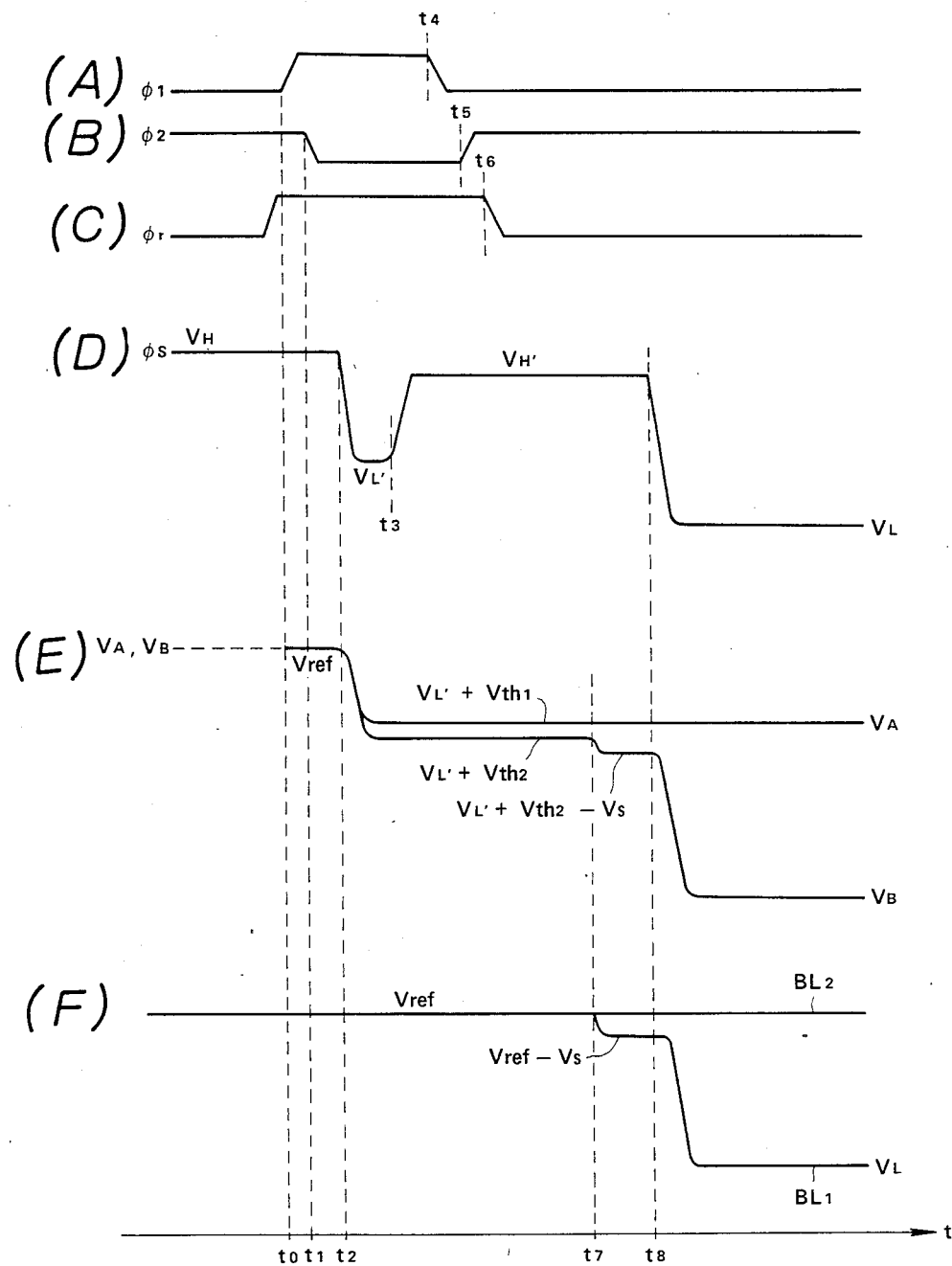
FIGS. 2(A) to 2(F) are timing diagrams used in explaining the operation of the sense amplifier of FIG. 1.

The operation of sense amplifier 11 embodying the invention will now be described with reference to FIG. 2. Voltage $V_A$ (line E in FIG. 2) is the voltage taken at the connection point between capacitor $C_1$ and gate electrode $G_1$, while voltage $V_B$ is the voltage taken at the connection point between capacitor $C_2$ and gate electrode $G_2$. Prior to time $t_0$, that is, prior to the precharging operation of sense amplifier 11, control signal $\phi_1$ (line A) in FIG. 2 is at a low level to open switches $S_{11}$ and $S_{21}$, control signal $\phi_2$ (line B) in FIG. 2 is at a high level to close switches $S_{12}$ and $S_{22}$, control signal $\phi_s$ (line D) in FIG. 2 is at high voltage $V_H$ so that transistors $M_1$ and $M_2$ are OFF and control signal $\phi_r$ (line C) in FIG. 2 is at a low level to turn OFF control transistors $Mr_1$ and $Mr_2$. As control signal $\phi_r$ rises to its high level, it turns ON control transistors $Mr_1$ and $Mr_2$ to supply reference voltage $V_{ref}$ to bit lines $BL_1$ and $BL_2$ (line F) on FIG. 2. Since transistors $M_1$ and $M_2$ remain OFF, voltages $V_A$ and $V_B$ are undefined at this time. Thereafter, at time $t_0$, to start the precharging operation, control signal $\phi_1$ goes to its high level from its low level to close switches $S_{11}$ and $S_{21}$ and thereby connect gate electrodes $G_1$ and $G_2$ to bit lines $BL_1$ and $BL_2$, through closed switches $S_{12}$, $S_{22}$ respectively. Consequently, voltages $V_A$ and $V_B$ both go to $V_{ref}$.

At time $t_1$, control signal $\phi_2$ goes from its high level to its low level, opening switches $S_{12}$ and $S_{22}$ to break the connection between drain electrodes $SD_{11}$ and $SD_{21}$ and bit lines $BL_1$ and $BL_2$, respectively. This places transistors $M_1$ and $M_2$ into their diode configurations, so that they operate equivalently as diodes connected in series with capacitors $C_1$ and $C_2$, respectively. Since the voltages on bit lines $BL_1$ and $BL_2$ and voltages $V_A$ and $V_B$ are all $V_{ref}$, capacitors $C_1$ and $C_2$ do not charge. Since control signal $\phi_s$ is still at the high level of voltage $V_H$ greater than $V_{ref}$, the "diodes" are reversed biased and no current flows.

At time $t_2$, control signal $\phi_s$ is reduced to an intermediate low voltage $V_L'$ which is higher than low voltage $V_L$ but lower than $V_{ref}$ so as to permit the "diodes" to be forward biased. Consequently, voltages corresponding to threshold voltages $V_{th1}$ and $V_{th2}$ of transistors $M_1$ and $M_2$, respectively are applied to capacitors $C_1$ and $C_2$. In particular, voltage $V_A$ at gate electrode $G_1$ goes to a voltage $V_L' + V_{th1}$, that is, the voltage $V_L'$ at the anode of the "diode" plus the diode voltage $V_{th1}$. Correspondingly, the voltage $V_B$ at gate electrode $G_2$ goes to $V_L' + V_{th2}$. Consequently, the voltage difference between voltage $V_A$ at one terminal of capacitor $C_1$ and voltage $V_{ref}$ at bit line $BL_2$ at the other terminal of capacitor $C_1$, i.e. the voltage to which capacitor $C_1$ precharges, is $$V_{C1} = V_{ref} - (V_L' + V_{th1})$$

Correspondingly, the voltage difference across the two terminals of capacitor $C_2$, i.e. the voltage to which capacitor $C_2$ precharges, is $$V_{C2} = V_{ref} - (V_L' + V_{th2}).$$

As is readily apparent, the magnitude of the difference between the two precharged voltages is $|V_{th1} - V_{th2}|$, that is, the dispersion threshold voltage $\Delta V_{th}$.

At time $t_3$, control signal $\phi_s$ is changed from $V_L'$ to an intermediate high voltage level $V_H'$ slightly lower than high voltage $V_H$. This temporarily reverse biases the "diodes" while switches $S_{11}$, $S_{21}$ are opened and switches $S_{12}$ and $S_{22}$ are closed, as discussed below, to prevent any noise spikes generated by the opening and closing of these switches from discharging capacitors $C_1$, $C_2$. If noise spikes are otherwise removed from the circuit, this change in control signal $\phi_s$ is unnecessary.

At time $t_4$, control signal $\phi_1$ goes from its high level to its low level to open switches $S_{11}$ and $S_{21}$ so as to disconnect gate electrode $G_1$ from drain electrode $SD_{11}$ of transistor $M_1$ and gate electrode $G_2$ from drain electrode $SD_{21}$ of transistor $M_2$, respectively. Transistors $M_1$ and $M_2$ are no longer in their diode configuration and return to conventional transistor operation.

At time $t_5$, control signal $\phi_2$ goes from its low level to its high level to again close switches $S_{12}$ and $S_{22}$ for connecting drain electrode $SD_{11}$ of transistor $M_1$ to bit line $BL_1$ and connecting drain electrode $SD_{21}$ of transistor $M_2$ to bit line $BL_2$. Sense amplifier 11 is now configured identically to sense amplifier 10 of FIG. 3 except for the presence of capacitors $C_1$ and $C_2$ carrying precharged voltages $V_{C1}$ and $V_{C2}$, respectively.

At time $t_6$, control signal $\phi_r$ goes from its high level to its low level to turn OFF control transistors $Mr_1$ and $Mr_2$ and to cut off the supply of $V_{ref}$ to bit lines $BL_1$ and $BL_2$. During the period from $t_3$ through $t_6$ up to the start of a sensing operation at a time $t_7$, the precharged voltages $V_{C1} = V_{ref} - (V_L' + V_{th1})$ and $V_{C2} = V_{ref} - (V_L' + V_{th2})$ are maintained on capacitors $C_1$ and $C_2$, respectively, without alteration. These voltages $V_{C1}$ and $V_{C2}$ are applied to gate electrodes $G_1$ and $G_2$, respectively, during the sensing operation of sense amplifier 11, as will now be described.

At time $t_7$, a sensing operation begins and, in response to turn on of an access transistor (not shown) at a select line of the memory cell to be read, the electrical charge stored in a capacitative element of the selected memory cell appears as a sense voltage $V_s$ at bit line $BL_1$. In the present example, it is assumed that the bit stored in the memory cell is a digital "0", and so the voltage of bit line $BL_1$ is $V_{ref} - V_s$, as in the example described above in connection with conventional sense amplifier 10. Similarly, the potential of bit line $BL_2$ is maintained at $V_{ref}$. As discussed above, if the bit stored in the memory cell were a digital "1" the voltage impressed on bit line $BL_1$ would be $V_{ref} + V_s$.

When voltage $V_{ref} - V_s$ appears on bit line $BL_1$, capacitor $C_2$ cannot discharge through transistor $M_2$, which is maintained in its OFF state by the intermediate high voltage $V_H'$, of control signal $\phi_s$ appearing at its source electrode $SD_{22}$. Therefore, voltage $V_{C2}$ cannot change to compensate for the change in the voltage on bit line $BL_1$ from $V_{ref}$ to $V_{ref} - V_s$, and so voltage $V_B$ appearing at gate electrode $G_2$ must change instead. In particular, $$V_B = V_{ref} - V_s - (-V_{ref} - [V_L' + V_{th2}]) = V_L' + V_{th2} - V_s.$$

At the same time, the voltage at bit line $BL_2$ remains at $V_{ref}$, so that voltage $V_A$ at gate electrode $G_1$ is $$V_A = V_{ref} - [V_{ref} - (V_L' + V_{th1})] = V_L' + V_{th1}$$

In other words, voltages $V_A$ and $V_B$ are higher than the voltages which would appear in conventional sense amplifier 10 by the respective threshold voltages $V_{th1}$ and $V_{th2}$. Therefore, the gate to source voltages $V_{GS1}$ and $V_{GS2}$ which determine when transistors $M_1$ and $M_2$ are respectively turned ON are fully compensated by the respective threshold voltages $V_{th1}$ and $V_{th2}$, and sense amplifier 11 has extremely high sensitivity.

Thus, when, at a time $t_8$, control signal $\phi_s$ is lowered from intermediate high voltage $V_H'$ toward low voltage $V_L$ to start the latching of transistors $M_1$ and $M_2$, gate to source voltage $V_{GS1}$ between gate electrode $G_1$ and source electrode $SD_{12}$ is $$V_{GS1} = V_A - \phi_s$$
$$= V_L' + V_{th1} - \phi_s,$$

while the gate to source voltage $V_{GS2}$ between gate electrode $G_2$ and source electrode $SD_{22}$ of transistor $M_2$ is $$V_{GS2} = V_B - \phi_s$$
$$= V_L' + V_{th2} - V_s - \phi_s.$$

It is readily apparent that the relation $$VGS_1 > VGS_2$$

is equivalent to $$V_A - \phi_s - V_{th1} > V_B - \phi_s - V_{th2}$$

which is, in turn equivalent to $$V_L' - \phi_s > V_L' - \phi_s - V_s$$

and holds for all values of control signal $\phi_s$ from $V_H'$ to $V_L$. Therefore, transistor $M_1$ will always be turned ON first and the effect of the dispersion of the threshold voltages $V_{th1}$ and $V_{th2}$ is compensated. Thereafter, in a manner identical to the described operation of the known sense amplifier 10, when transistor $M_1$ is turned ON, the voltage at drain electrode $SD_{11}$ is pulled down to low voltage $V_L$ as control signal $\phi_s$ is reduced to that low voltage $V_L$, and voltage $V_B$ is similarly lowered, since transistor $M_2$ remains OFF so that capacitor $C_2$ cannot discharge therethrough. Thus, the voltage appearing at bit line $BL_1$ is reduced to the low voltage $V_L$ while the voltage at bit line $BL_2$ is maintained at $V_{ref}$ to complete the latching operation.

In accordance with the present invention, sense amplifier 11 accumulates, at capacitors $C_1$ and $C_2$, precharged voltages corresponding to the threshold dispersion voltage $\Delta V_{th}$ of the threshold voltages $V_{th1}$ and $V_{th2}$ of transistors $M_1$ and $M_2$, so that, during the sensing operation this threshold dispersion voltage $\Delta V_{th}$ is compensated for completely. Consequently, a manufacturing process may be employed for providing large numbers of chips including sense amplifiers according to the present invention on a single wafer with the assurance that even those sense amplifiers having significant threshold voltage dispersions will function acceptably. Therefore, the yield of such process, defined as the number of good chips on the wafer divided by the total number of chips on the wafer, will be increased. Furthermore, since the compensation for the threshold dispersion voltage $V_{th}$ is performed dynamically during each precharging operation prior to each sensing operation, the continuing accuracy of the sense amplifiers is not so heavily dependent upon precision in the manufacturing process, so that the sense amplifiers according to the present invention have a high time dependent reliability, defined as the number of devices still operating acceptably after a period of time divided by the total number of devices originally produced.

Even when the capacitance within each memory cell is reduced, for example by a factor of 5 or 6, as further miniaturization is achieved, a reliable operation free of malfunction is available due to the high sensitivity of the sense amplifier in accordance with the present invention. Advantageously, an excellent result may be obtained by applying the sense amplifier according to the present invention to a memory device fabricated using a silicon-on-insulator (SOI) structure.

Although the above description has been given for a preferred embodiment using NMOS technology, it will be apparent that an equivalent sense amplifier could be constructed using PMOS technology, with suitable inversion of the control signals and voltage reference levels in accordance with conventional principles.

Although a preferred embodiment of the present invention has been described in detail with reference to the drawings, it will be apparent that the invention is not limited to the precise embodiment, and that many modifications and variations may be effected therein by one skilled in the art without departing from the spirit or scope of the invention as defined by the appended claims.

I claim:

1. A sense amplifier of the type including first and second bit lines for receiving sensed signals and first and second cross-coupled field effect transistors each having a gate electrode and first and second current carrying electrodes, comprising;
   capacitive means for capacitively coupling said gate electrodes of said first and second transistors with said second and first bit lines, respectively;
   first switching means for separably connecting said gate electrodes of said first and second transistors with the first current carrying electrodes of said first and second transistors, respectively; and
   second switching means for separably connecting said first current carrying electrodes of said first and second transistors with said first and second bit lines, respectively;
   said first and second switching means and said second current carrying electrodes of said first and second transistors being responsive to respective control signals for compensating said sense amplifier for threshold voltage differences of said first and second transistors.

2. A sense amplifier according to claim 1, wherein said capacitive means supplies voltages compensating for a dispersion between the threshold voltages of said first and second transistors to said gate electrodes during a sensing operation of said sense amplifier.

3. A sense amplifier according to claim 2, wherein said first and second switching means are responsive to the respective control signals for precharging said capacitive means to precharged voltages prior to said sensing operation of said sensed amplifier, said capacitive means supplying the precharged voltages to said gate electrodes during said said sensing operation.

4. A sense amplifier according to claim 3, wherein said capacitive means includes a first capacitor connected between the gate electrode of said first transistor and said second bit line and a second capacitor connected between said gate electrode of said second transistor and said first bit line.

5. A sense amplifier according to claim 3, wherein said second current carrying electrodes of said first and second transistors are coupled together to receive a common control signal to permit or prevent turn on of said transistors, said precharged voltages are determined such that when said common control signal permits turn on, the difference between the voltage appearing at the gate electrode of said first transistor and the threshold voltage thereof differs from the difference between the voltage appearing at the gate electrode of said second transistor and the threshold voltage thereof by an amount equal to a sensed signal appearing on a selected one of said bit lines, whereby a selected one of said first and second transistors will always turn on before the other of said transistors in dependence on the sensed signal.

* * * * *